United States Patent
Sekine et al.

(10) Patent No.: US 7,842,958 B1
(45) Date of Patent: Nov. 30, 2010

(54) LIGHT-EMITTING DIODE, LIGHT-EMITTING DEVICE, LIGHTING APPARATUS, DISPLAY, AND SIGNAL LIGHT

(75) Inventors: Shigenobu Sekine, Katsushika-ku (JP); Yurina Sekine, Katsushika-ku (JP); Yoshiharu Kuwana, Katsushika-ku (JP)

(73) Assignee: Napra Co., Ltd., Tokyo (JP)

( * ) Notice: Subject to any disclaimer, the term of this patent is extended or adjusted under 35 U.S.C. 154(b) by 0 days.

(21) Appl. No.: 12/753,418

(22) Filed: Apr. 2, 2010

(30) Foreign Application Priority Data

Sep. 10, 2009 (JP) ............................ 2009-208992

(51) Int. Cl.
*H01L 29/18* (2006.01)
(52) U.S. Cl. .......................................... 257/88; 349/68
(58) Field of Classification Search ........................ None
See application file for complete search history.

(56) References Cited

U.S. PATENT DOCUMENTS

| 6,037,612 | A | * | 3/2000 | Nishimura et al. | .......... 257/103 |
| 6,144,043 | A | * | 11/2000 | Ogihara et al. | .............. 257/88 |
| 2007/0048973 | A1 | | 3/2007 | Koizumi et al. | |
| 2008/0121903 | A1 | | 5/2008 | Hiramatsu et al. | |

FOREIGN PATENT DOCUMENTS

| JP | 8-255926 | 10/1996 |
| JP | 10-56235 | 2/1998 |
| JP | 2001-210867 | 8/2001 |
| JP | 2005-322722 | 11/2005 |
| JP | 2007-42781 | 2/2007 |
| JP | 2007-67017 | 3/2007 |
| JP | 2007-287849 | 11/2007 |
| JP | 2008-153634 | 7/2008 |
| JP | 2009-71337 | 4/2009 |

\* cited by examiner

*Primary Examiner*—David Nelms
*Assistant Examiner*—Lucy P Chien
(74) *Attorney, Agent, or Firm*—Oblon, Spivak, McClelland, Maier & Neustadt, L.L.P.

(57) ABSTRACT

A light-emitting diode includes a substrate, a semiconductive light-emitting layer, and electrodes. The semiconductive light-emitting layer is deposited on one side of the substrate. The electrodes are composed of a conductive material filled in pores leading to the semiconductive light-emitting layer through the substrate. The semiconductive light-emitting layer includes sequentially deposited n-type and p-type semiconductive layers. The electrodes include n-side and p-side electrodes. One of the n-side and p-side electrodes penetrates through one of the n-type and p-type semiconductive layers, which is disposed closer to the substrate but not targeted for connection, and terminates with a tip thereof located within the other semiconductive layer. The other of the n-side and p-side electrodes penetrates through the substrate from the other side opposite to the one side of the substrate and terminates with a tip thereof located within the one semiconductive layer disposed closer to the substrate.

18 Claims, 9 Drawing Sheets

LIGHT-EMITTING DIODE, LIGHT-EMITTING DEVICE, LIGHTING APPARATUS, DISPLAY, AND SIGNAL LIGHT

BACKGROUND OF THE INVENTION

1. Field of the Invention

The present invention relates to a light-emitting diode, and a light-emitting device, a lighting apparatus, a display, and a signal light using the same.

2. Description of the Related Art

Light-emitting diodes have the advantages of energy conservation and long service life and have come to attract attention as a light source of a light-emitting device, a color image display device, a backlight of a liquid crystal panel, or a traffic light.

Taking a blue light-emitting diode as an example, the light-emitting diode has a structure that a buffer layer, an n-type GaN layer, an active layer, a p-type GaN layer, and a transparent electrode layer are sequentially deposited on a substrate made of sapphire, as disclosed in Japanese Unexamined Patent Application Publication No. 2001-210867, for example.

On the transparent electrode layer, partially, there is formed a p-side electrode, while the transparent electrode layer, the p-type GaN layer, and the active layer are partially dry-etched to partially expose the n-type GaN layer, providing a structure where an n-side electrodes is formed on the exposed n-type GaN layer. Similar multilayer structures and electrode structures are also disclosed in Japanese Unexamined Patent Application Publication Nos. 2009-71337 and 2008-153634.

In the conventional light-emitting diode, as described above, while the p-side electrode is formed on the transparent electrode layer that will serve as a light-emitting surface, the transparent electrode layer, the p-type GaN layer, and the active layer are partially dry-etched to partially expose the n-type GaN layer, providing a structure where the n-side electrode is formed on the exposed n-type GaN layer, so that the light-emitting area decreases by the area occupied by the p-side and n-side electrodes. As a matter of course, this also decreases the light emission amount, as well as the light emission efficiency.

In addition, since the structure is such that the n-side electrode is formed in a restricted and concentrated manner at the portion where the n-type GaN layer is exposed, the electric current tends to concentrate on this portion, preventing uniform surface light emission.

In order to perform dry-etching for formation of the n-side electrode, moreover, an ICP-RIE has to be used. The ICP-RIE, which is used for many purposes in Si micromachining (MEMS), as well as for high-frequency device processing using compound semiconductor etching or thin-film magnetic head processing using AlTiC etching, is extremely expensive. The great equipment cost is reflected in the increased cost of light-emitting diodes.

SUMMARY OF THE INVENTION

It is an object of the present invention to provide a light-emitting diode with a large light emission amount and a high light emission efficiency, and a light-emitting device, a lighting apparatus, a display, and a signal light using the same.

It is another object of the present invention to provide a light-emitting diode which facilitates surface diffusion of current to realize uniform surface light emission, and a light-emitting device, a lighting apparatus, a display, and a signal light using the same.

It is still another object of the present invention to provide a low-cost light-emitting diode, and a light-emitting device, a lighting apparatus, a display, and a signal light using the same.

In order to achieve at least one of the above objects, the present invention provides a light-emitting diode comprising a substrate, a semiconductive light-emitting layer, and electrodes. The semiconductive light-emitting layer is deposited on one side of the substrate. The electrodes are intended to supply an electrical energy to the semiconductive light-emitting layer and composed of a conductive material filled in pores leading to the semiconductive light-emitting layer through the substrate.

In the prior art, the electrodes for supplying an electrical energy to the semiconductive light-emitting layer have a structure that the p-side electrode is partially formed on the transparent electrode layer while the n-side electrode is formed on the n-type GaN layer exposed by dry-etching. This has caused the above-described problems.

In the present invention, as means for solving the problems, the electrodes are composed of a conductive material filled in pores leading to the semiconductive light-emitting layer through the substrate. With this structure, the following effects can be obtained.

(a) Since the electrodes are composed of a conductive material filled in pores leading to the semiconductive light-emitting layer through the substrate, the electrodes can be led out to the back side of the substrate for connection to an external power supply. Since neither p-side electrodes nor n-side electrodes appear on the light-emitting surface, the electrodes will never cause a decrease in the light-emitting area. This achieves a light-emitting diode with a large light emission amount and a high light emission efficiency.

(b) The surface density of current in the semiconductive light-emitting layer depends on the surface density of the pores. By increasing and uniformizing the surface density of the pores with respect to the surface of the semiconductive light-emitting layer, accordingly, the surface diffusion of current for the semiconductive light-emitting layer can be facilitated to realize uniform surface light emission without having any transparent electrode layer. Thus, the transparent electrode layer can be omitted to achieve a simplified fabrication process and ensuing improved production efficiency and cost reduction. Moreover, eliminating light energy loss due to the transparent electrode layer results in improving the light emission amount and the light emission efficiency. However, it is not necessarily required to eliminate the transparent electrode layer.

(c) The pores may easily be formed using a well-known hole forming process such as laser drilling process or chemical process. In addition, since the electrodes are composed of a conductive material filled in the pores thus formed, a process of filling a conductive paste or molten metal into the pores and applying pressure thereto may be employed for formation of the electrodes. This process enables formation of dense electrodes without leaving any void in the pores. A more desirable result can be obtained by hardening them while keeping the pressure.

Furthermore, the above fabrication process belongs to a press process and makes the cost of equipment considerably less expensive and requires less processing time, as compared with a conventional dry-etching process using an ICP-RIE.

Preferably, the pores are distributed with a given surface density. With this, the surface diffusion of current for the semiconductive light-emitting layer can be facilitated to achieve uniform surface light emission. The electrode in one of adjacent pores serves as a p-side electrode, while the electrode in the other pore serves as an n-side electrode. The pore has a pore diameter on the order of μm.

It is also possible that a transparent electrode layer is disposed at a light-emitting side of the semiconductive light-emitting layer and a portion of the electrode, e.g., one end of the p-side electrode is connected to the transparent electrode layer. With this, the surface diffusion of current can be facilitated not only by the distribution of the electrodes but also by the transparent electrode layer.

The light-emitting diode may be any one of red, green and blue light-emitting diodes or a white light-emitting diode.

The present invention also discloses a light-emitting device, a lighting apparatus, a display (display device), and a signal light using the above-described light-emitting diode.

As described above, the following effects can be obtained according to the present invention.

(a) It is possible to provide a light-emitting diode with a large light emission amount and a high light emission efficiency, and a light-emitting device, a lighting apparatus, a display, and a signal light using the same.

(b) It is possible to provide a light-emitting diode which facilitates surface diffusion of current to realize uniform surface light emission, and a light-emitting device, a lighting apparatus, a display, and a signal light using the same.

(c) It is possible to provide a low-cost light-emitting diode, and a light-emitting device, a lighting apparatus, a display, and a signal light using the same.

Other objects, structures and advantages of the present invention will be described in more detail with reference to the accompanying drawings. The accompanying drawings are given by way of illustration only.

DESCRIPTION OF THE PREFERRED EMBODIMENTS

1. Light-Emitting Diode

Figure 1:
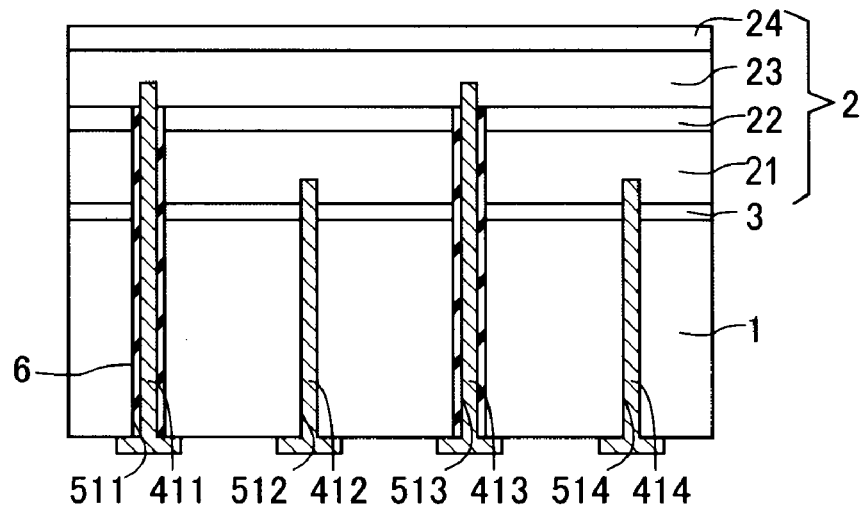
FIG. 1 is a partial sectional view showing an embodiment of a light-emitting diode according to the present invention.

A light-emitting diode according to the present invention includes a substrate 1, a semiconductive light-emitting layer 2, and electrodes (411 to 444). The semiconductive light-emitting layer 2 is deposited on one side of the substrate 1. The electrodes (411 to 444) are intended to supply an electrical energy to the semiconductive light-emitting layer 2 and composed of a conductive material filled in pores (511 to 544) leading to the semiconductive light-emitting layer 2 through the substrate 1.

Typically, the substrate 1 is a sapphire substrate 1. Since a buffer layer 3 lies on one side of the substrate 1, the semiconductive light-emitting layer 2 is mounted on the substrate 1 with the buffer layer 3 between.

The semiconductive light-emitting layer 2 is well-known in light-emitting diodes. It has pn junction, and typically, can be made of a III-V group compound semiconductor. However, it is not limited to known technologies but includes any compound semiconductors that may possibly be suggested in future.

In the present invention, the light-emitting diode may be any one of red, green and blue light-emitting diodes or a white light-emitting diode. In such light-emitting diodes, examples of semiconductive materials for forming the semiconductive light-emitting layer 2 are as follows.

Figure 2:
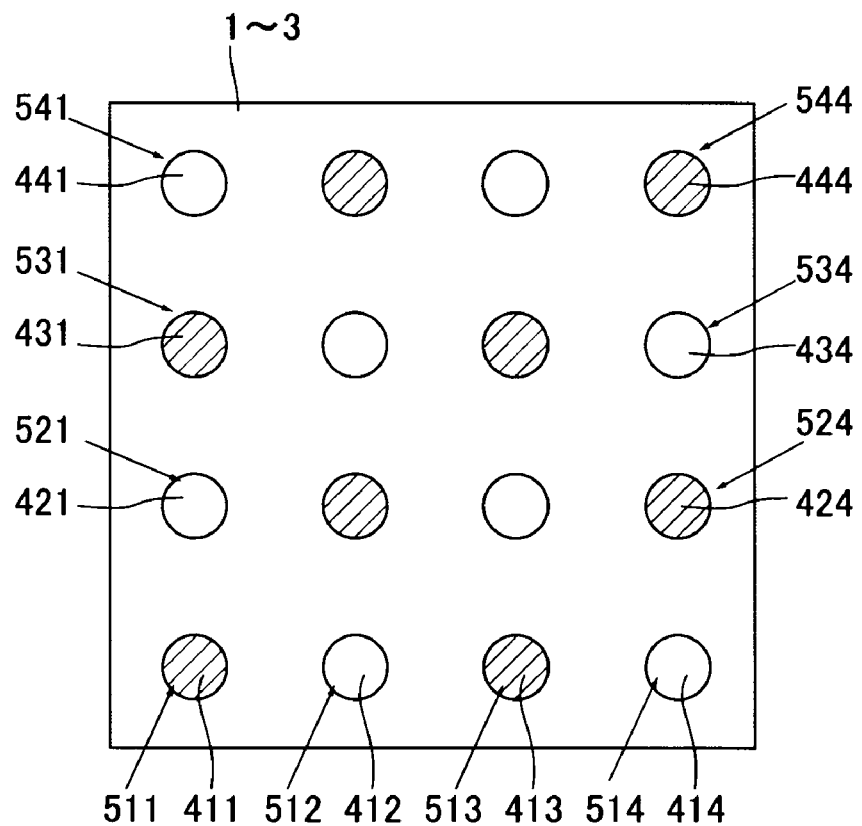
FIG. 2 is a bottom view of the light-emitting diode shown in FIG. 1.

(a) Red Light-Emitting Diode (i) In case of using an arsenic (As)-based compound semiconductor e.g., AlGaAs-based red light-emitting diode (ii) In case of using an arsenic (As) and phosphorus (P)-based compound semiconductor e.g., GaAsP-based red light-emitting diode (b) Green Light-Emitting Diode (i) In case of using a phosphorus (P)-based compound semiconductor e.g., GaP-based green light-emitting diode (ii) In case of using a nitrogen (N)-based compound semiconductor e.g., GaN-based green light-emitting diode (c) Blue Light-Emitting Diode In case of using a nitrogen (N)-based compound semiconductor e.g., GaN-based blue light-emitting diode (d) White Light-Emitting Diode In case of using a nitrogen (N)-based compound semiconductor e.g., GaN-based white light-emitting diode (e) Orange Light-Emitting Diode In case of using a phosphorus (P)-based quaternary mixed crystal compound semiconductor e.g., AlGaInP-based orange light-emitting diode FIGS. 1 and 2 illustrate an embodiment of a GaN-based blue light-emitting diode using a nitrogen (N)-based compound semiconductor. Referring to the figures, the semiconductive light-emitting layer 2 has a structure that an n-type semiconductive layer 21, an active layer 22, a p-type semiconductive layer 23, and a top layer 24 are deposited in the named order on a buffer layer 3 deposited on one side of the substrate 1 made of sapphire. For example, the n-type semiconductive layer 21 is formed by a Si-doped GaN layer, while the p-type semiconductive layer 23 is formed by a Mg-doped GaN layer.

The active layer 22 has a multiple quantum well (MQW) structure such as of GaN—InGaN and may have an Al—GaN superlattice cap layer on a side which is in contact with the p-type semiconductive layer 23. The top layer 24 is not required to be a transparent electrode layer as long as being an optically-transparent optical layer. That is, it is possible not to have any transparent electrode on the light-emitting surface of the semiconductive light-emitting layer 2.

In the prior art, the electrodes have a structure that the p-side electrode is partially formed on the transparent electrode layer while the n-side electrode is formed on the n-type GaN layer exposed by dry-etching. This has caused the problems pointed out hereinabove.

In the present invention, as means for solving the problems, the electrodes (411 to 444) are composed of a conductive material filled in pores (511 to 544) leading to the semiconductive light-emitting layer 2 through the substrate 1.

Preferably, the pores (511 to 544) are distributed with a given surface density. With this, the electrodes (411 to 444) filled in the pores (511 to 544) can serve as an alternative electrode to the conventional transparent electrode layer, facilitating the surface diffusion of current for the semiconductive light-emitting layer 2 to achieve uniform surface light emission. Thus, while improving the light emission amount and the light emission efficiency, the transparent electrode layer, which has been indispensable in the prior art, can be omitted to achieve a simplified fabrication process and cost reduction. Moreover, the light energy loss due to the transparent electrode layer can be eliminated to improve the light emission amount and the light emission efficiency.

In the embodiment, the pores (511 to 544) are arranged in the form of 4×4 matrix at a given pitch distance on the substrate 1. The number of rows and the number of columns are arbitrary. The pore (511 to 544) has a pore diameter on the order of µm. The pitch distance may be on a similar order of magnitude.

With the light-emitting diode described above, the following effects can be obtained.

(a) Since the electrodes (411 to 444) are composed of a conductive material filled in the pores (511 to 544) leading to the semiconductive light-emitting layer 2 through the substrate 1, the electrodes (411 to 444) can be led out to the back side of the substrate 1 for connection to an external power supply. Since neither p-side electrodes nor n-side electrodes appear on the light-emitting surface, the electrode structure will never cause a decrease in the area of the light-emitting surface. This achieves a light-emitting diode with a large light emission amount and a high light emission efficiency.

(b) The current distribution in the semiconductive light-emitting layer 2 depends on the distribution of the pores (511 to 544). By densifying and uniformizing the planar distribution of the pores (511 to 544) with respect to the surface of the semiconductive light-emitting layer 2, accordingly, the surface diffusion of current for the semiconductive light-emitting layer 2 can be facilitated to uniformize the current distribution and realize uniform surface light emission. However, it is not necessarily required to eliminate the transparent electrode layer.

(c) The pores (511 to 544) may easily be formed using a well-known hole forming process such as laser prosess or chemical process. In addition, since the electrodes (411 to 444) are composed of a conductive material filled in the pores (511 to 544) thus drilled, a process of filling a conductive paste or molten metal into the pores (511 to 544) and applying pressure thereto may be employed for formation of the electrodes. This process enables formation of dense electrodes (411 to 444) without leaving any void in the pores (511 to 544). A more desirable result can be obtained by hardening them while keeping the pressure.

The above pressure-filling type fabrication process belongs to a press process and makes the cost of equipment considerably less expensive and requires less processing time, as compared with a conventional dry-etching process using an ICP-RIE. Thus, it is possible to achieve a low-cost light-emitting diode.

The electrodes (411 to 444) may be formed of a conductive past, as described above, but are preferably formed of a molten metal from the viewpoint of improving electrical characteristics and quality of the electrode itself. In this case, major examples of metal materials to be used include bismuth (Bi), indium (In), tin (Sn), and copper (Cu). Particularly, if bismuth (Bi) is contained, dense electrodes (411 to 444) can be formed without leaving any void or cavity in the pores (511 to 544) because of volume expansion characteristics of the bismuth (Bi) at the time of solidification. For the molten metal, use can be made of molten powder of particles (nanoparticles) which are made of the above metal materials as aggregate of polycrystalline substances with a particle size of 1 µm or less and a crystal size of 200 nm or less.

Taking adjacent ones among the pores (511 to 544), such as the pores 512 and 511, 513, for example, the electrodes 411, 413 in one pores 511, 513 serve as a p-side electrode, while the electrode 412 in the other pore 512 serves as an n-side electrode. In FIG. 2, the shaded electrodes are p-side electrodes, and the rest are n-side electrodes.

The electrodes 411, 413, which serve as a p-side electrode, penetrate through the substrate 1 and then through the buffer layer 3, the n-type semiconductive layer 21 and the active layer 22 to have their tips located within the p-type semiconductive layer 23. The electrodes 411, 413 are covered with an insulating film 6 at an area that requires electrical insulation. The electrode 412, which serves as an n-side electrode, penetrates through the substrate 1 and the buffer layer and terminates with its tip located within the n-type semiconductive layer.

Figure 3:
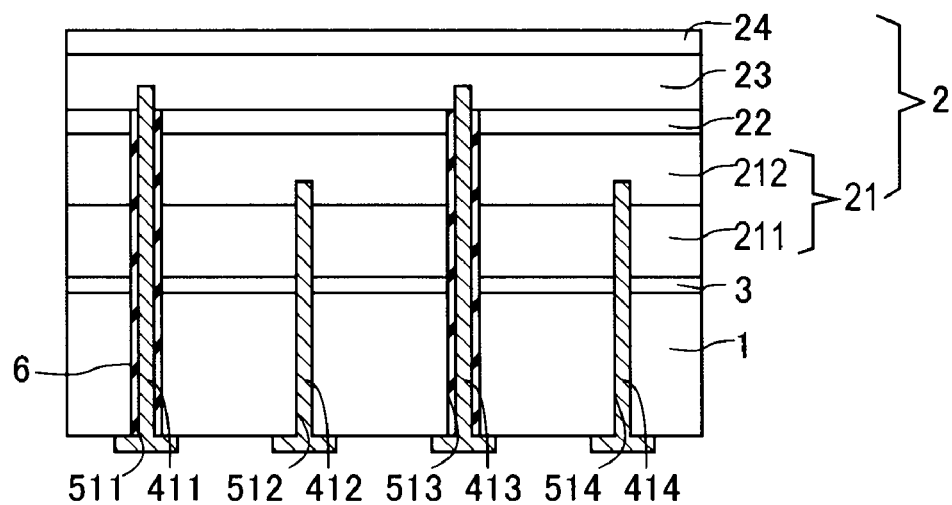
FIG. 3 is a partial sectional view showing another embodiment of a light-emitting diode according to the present invention.

FIG. 3 illustrates another embodiment of a light-emitting diode according to the present invention. In this figure, the portions corresponding to the components shown in FIGS. 1 and 2 are indicated by the same reference symbols to avoid duplicative explanation.

The embodiment shown in FIG. 3 is characterized in that the n-type semiconductive layer 21 has a multilayer structure of an undoped GaN layer 211 and a Si-doped GaN layer 212.

Taking adjacent ones among the pores (511 to 544), such as the pores 512 and 511, 513, for example, the electrodes 411, 413 filled in the pores 511, 513 penetrate through the substrate 1, the buffer layer 3, the n-type semiconductive layer 21, and the active layer 22 to have their tips located within the p-type semiconductive layer 23.

On the other hand, the electrode 412, which serves as an n-side electrode, penetrates through the substrate 1, the buffer layer 3, and the undoped GaN layer 211 and terminates with its tip located within the Si-doped GaN layer 212.

Figure 4:
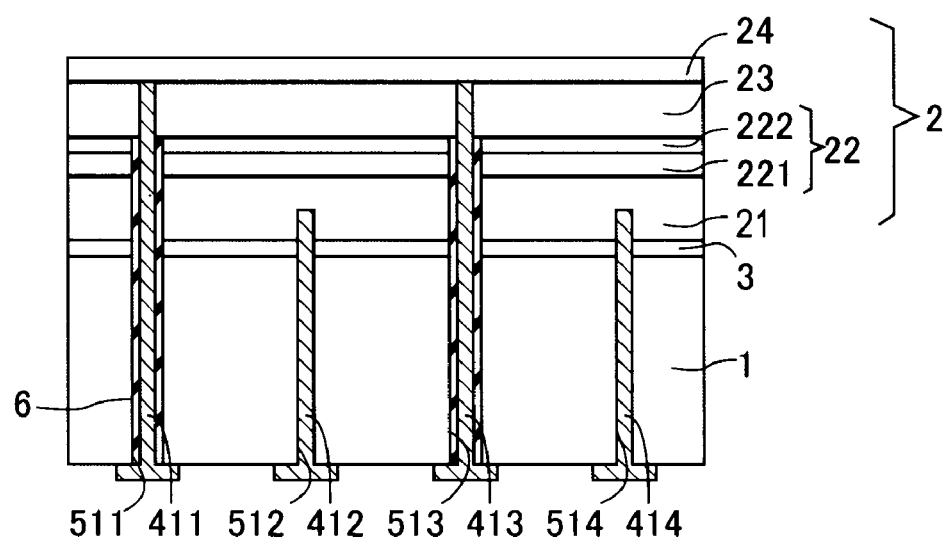
FIG. 4 is a partial sectional view showing still another embodiment of a light-emitting diode according to the present invention.

FIG. 4 illustrates still another embodiment of a light-emitting diode according to the present invention. In this figure, the portions corresponding to the components shown in FIGS. 1 and 2 are indicated by the same reference symbols to avoid duplicative explanation.

This embodiment is characterized in that the top layer 24 disposed on the light-emitting side of the semiconductive light-emitting layer 2 is an optically-transparent electrode layer. Among the electrodes (411 to 444), the p-side electrodes (411,413) are connected to the transparent electrode layer 24 at their one ends. With this, the surface diffusion of current can be facilitated not only by the distribution of the electrodes (411 to 444) but also by the transparent electrode layer 24.

Figure 5:
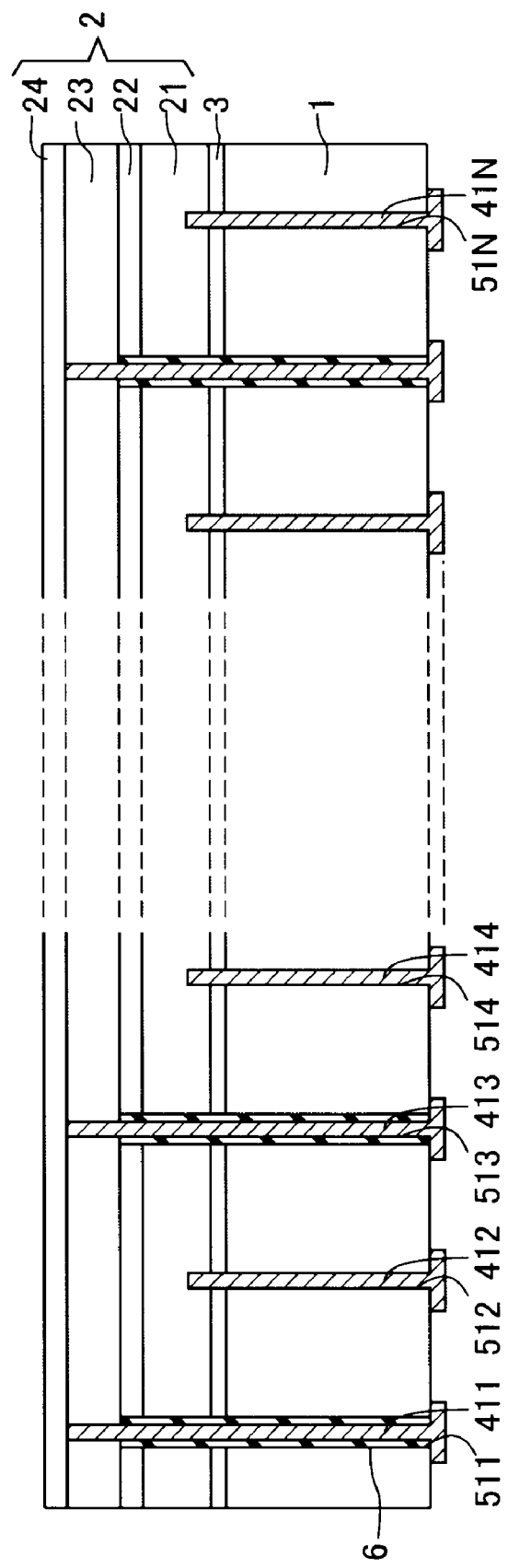
FIG. 5 is a partial sectional view showing yet another embodiment of a light-emitting diode according to the present invention.
Figure 6:
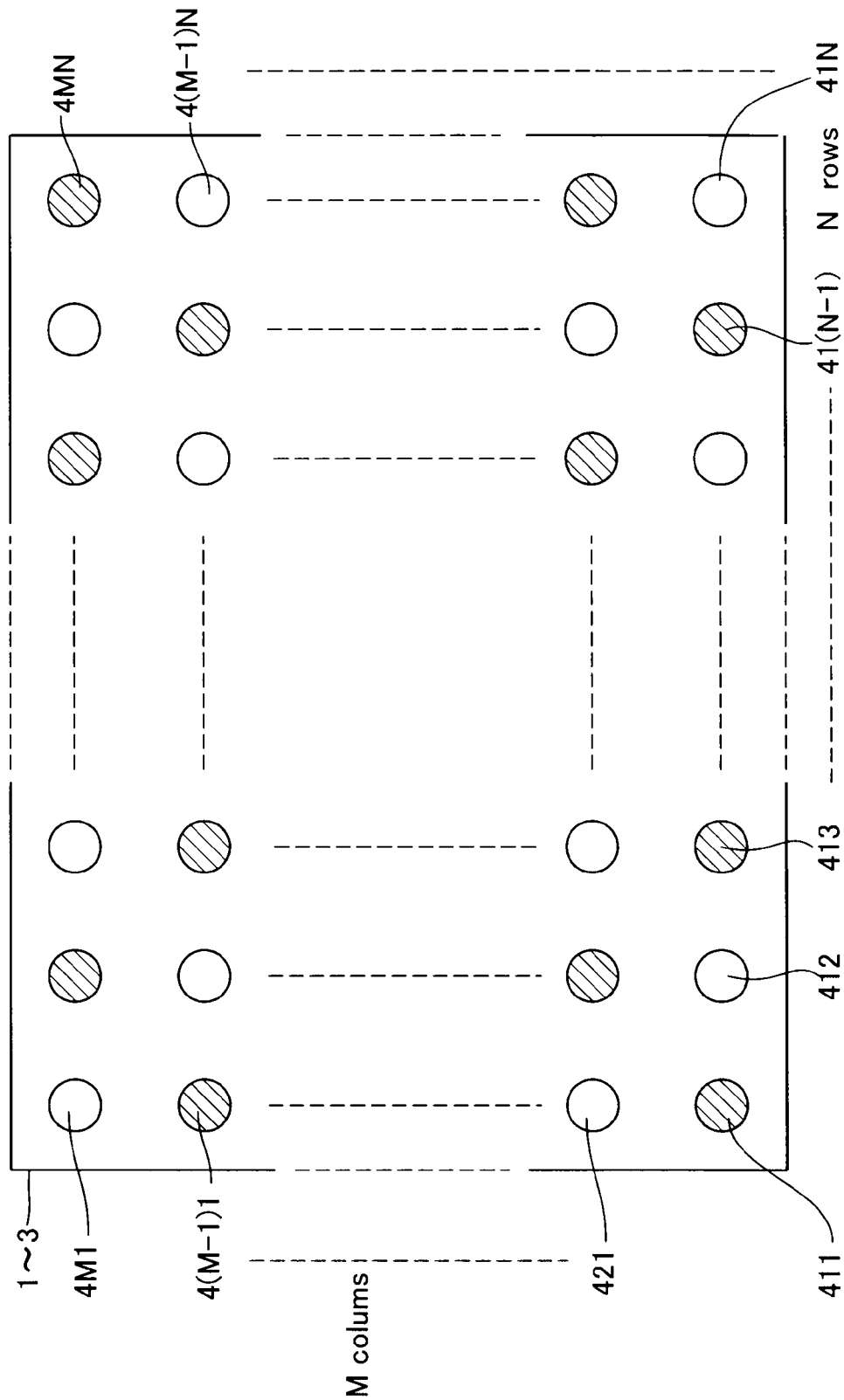
FIG. 6 is a bottom view of the light-emitting diode shown in FIG. 5.

Referring next to FIGS. 5 and 6, there is illustrated a light-emitting diode with a large light-emitting area. In these figures, the portions corresponding to the components shown in FIGS. 1 and 2 are indicated by the same reference symbols to avoid duplicative explanation.

In the embodiment of FIGS. 5 and 6, the pores (511 to 5NM) are arranged in the form of M×N matrix at a given pitch distance on the substrate 1. Thus, the electrodes (411 to 4NM) formed within the pores (511 to 5NM) are also arranged in the form of M×N matrix, ensuring a large light-emitting area and a large light emission amount in appropriate proportion to the number of M columns and the number of N rows.

2. Light-Emitting Device

The present invention discloses light-emitting devices according to two embodiments.

(1) Light-Emitting Device According to First Embodiment

Figure 7:
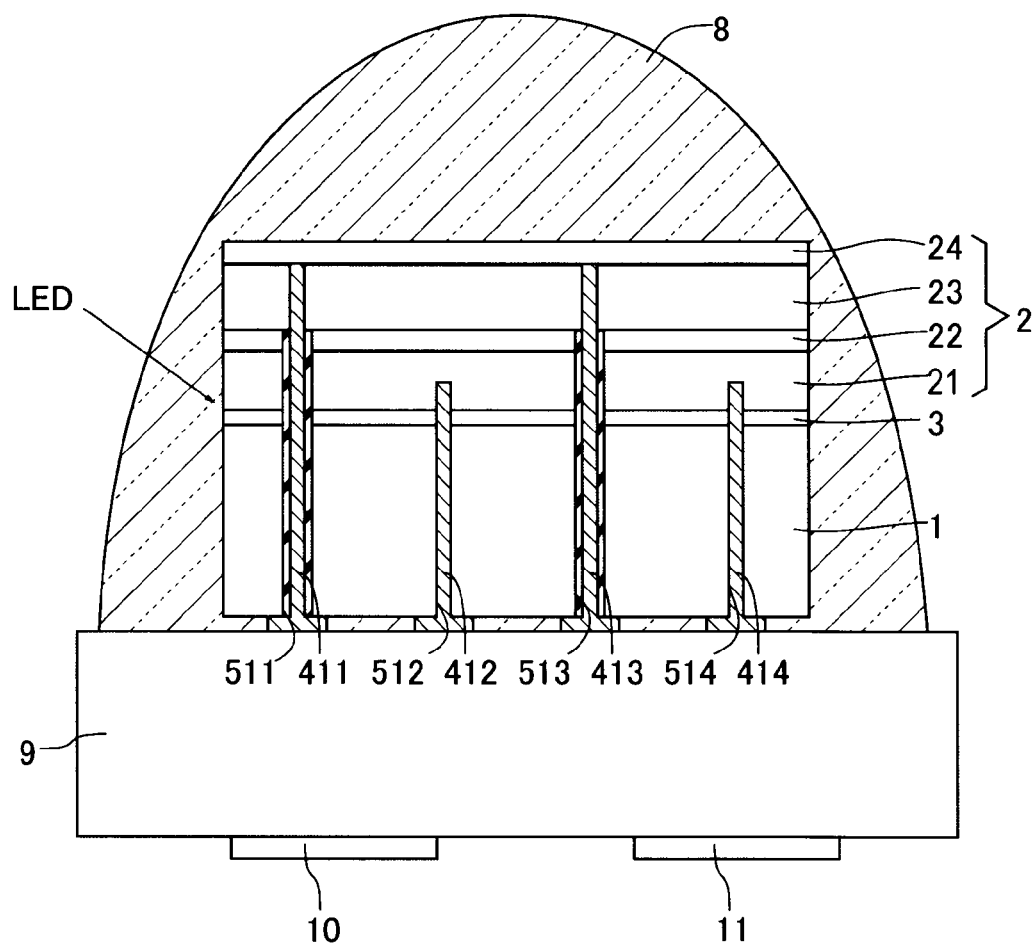
FIG. 7 is a partial sectional view showing an embodiment of a light-emitting device using a light-emitting diode according to the present invention.

Referring to FIG. 7, the light-emitting device according to a first embodiment includes a light-emitting diode LED and a phosphor 8. The light-emitting diode LED is the light-emitting diode according to the present invention, which has been described with reference to FIGS. 1 to 4. The phosphor 8 is disposed at the light-emitting side of the light-emitting diode LED for emitting light of a different color from that of the light-emitting diode LED.

If a blue light-emitting diode is used for the light-emitting diode LED and a substance which emits light whose color is complementary to blue light emitted from the blue light-emitting diode is used for the phosphor 8, for example, there is obtained white light (visible light). If a GaN-based compound semiconductor is used for the blue light-emitting diode, a YAG-based phosphor 8 can be used for the corresponding phosphor 8.

However, colored light from the light-emitting device, which varies over a wide range depending on the type of the light-emitting diode LED and the optical nature of the phosphor 8, is not limited to white light.

The light-emitting diode LED is mounted on one side of a motherboard 9, while electrodes 10, 11 are disposed on the other side of the motherboard 9 for feeding power to the electrodes 411 to 414 and so on. On one side of the motherboard 9, the phosphor 8 covers the light-emitting diode LED in the manner of so-called "bullet shape".

Figure 8:
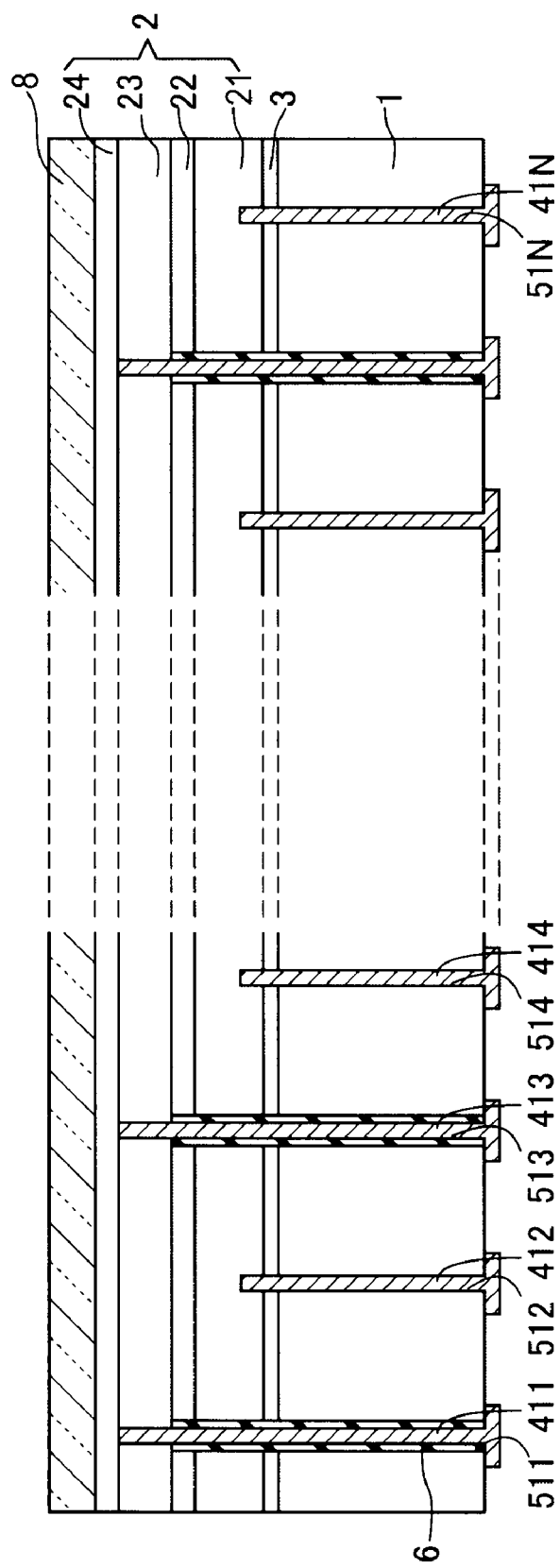
FIG. 8 is a partial sectional view showing another embodiment of a light-emitting device using a light-emitting diode according to the present invention.

Referring further to FIG. 8, there is illustrated a light-emitting device with an extremely large light-emitting area as compared with the light-emitting device shown in FIG. 7. This light-emitting device is suitable as a surface emitting device. The light-emitting diode LED is formed by arranging the pores (511 to 5MN) and the electrodes (411 to 4MN) in M columns and N rows, as described with reference to FIGS. 5 and 6, which ensures a large-area light-emitting surface. At the light-emitting side (light-emitting surface side) of the large-area light-emitting diode LED, a phosphor 8 is disposed for emitting light of a different color from that of the light-emitting diode LED.

If a blue light-emitting diode is used for the light-emitting diode LED and a substance which emits light whose color is complementary to blue light emitted from the blue light-emitting diode is used for the phosphor 8, there is obtained a large-area light-emitting device for white light (visible light), which is extremely useful for a lighting apparatus or a liquid crystal backlight.

(2) Light-Emitting Device According to Second Embodiment

Figure 9:
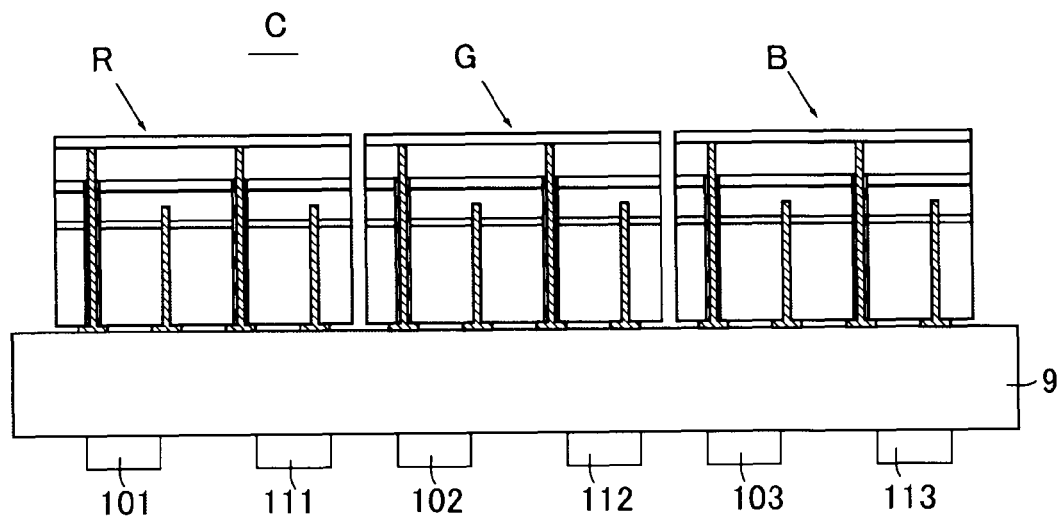
FIG. 9 is a partial sectional view showing still another embodiment of a light-emitting device using a light-emitting diode according to the present invention.
Figure 10:
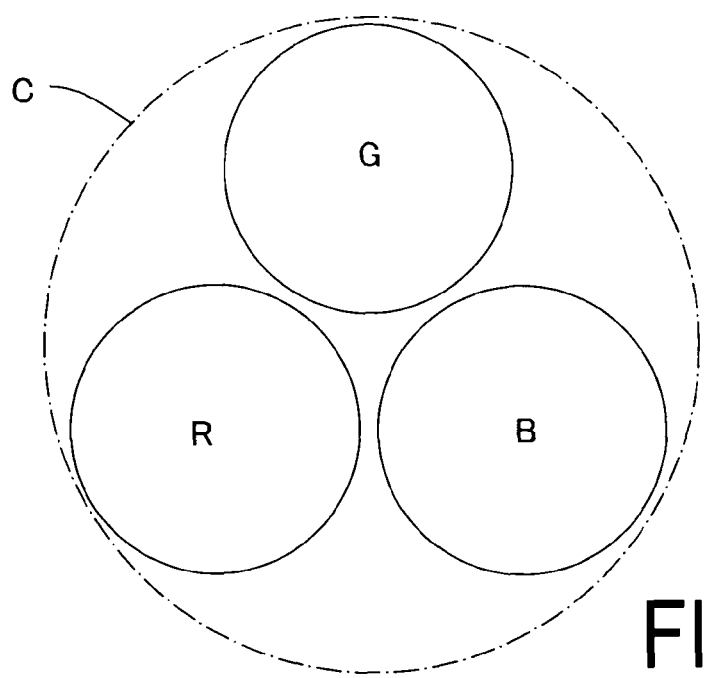
FIG. 10 is a plan view of the light-emitting device shown in FIG. 9.
Figure 11:
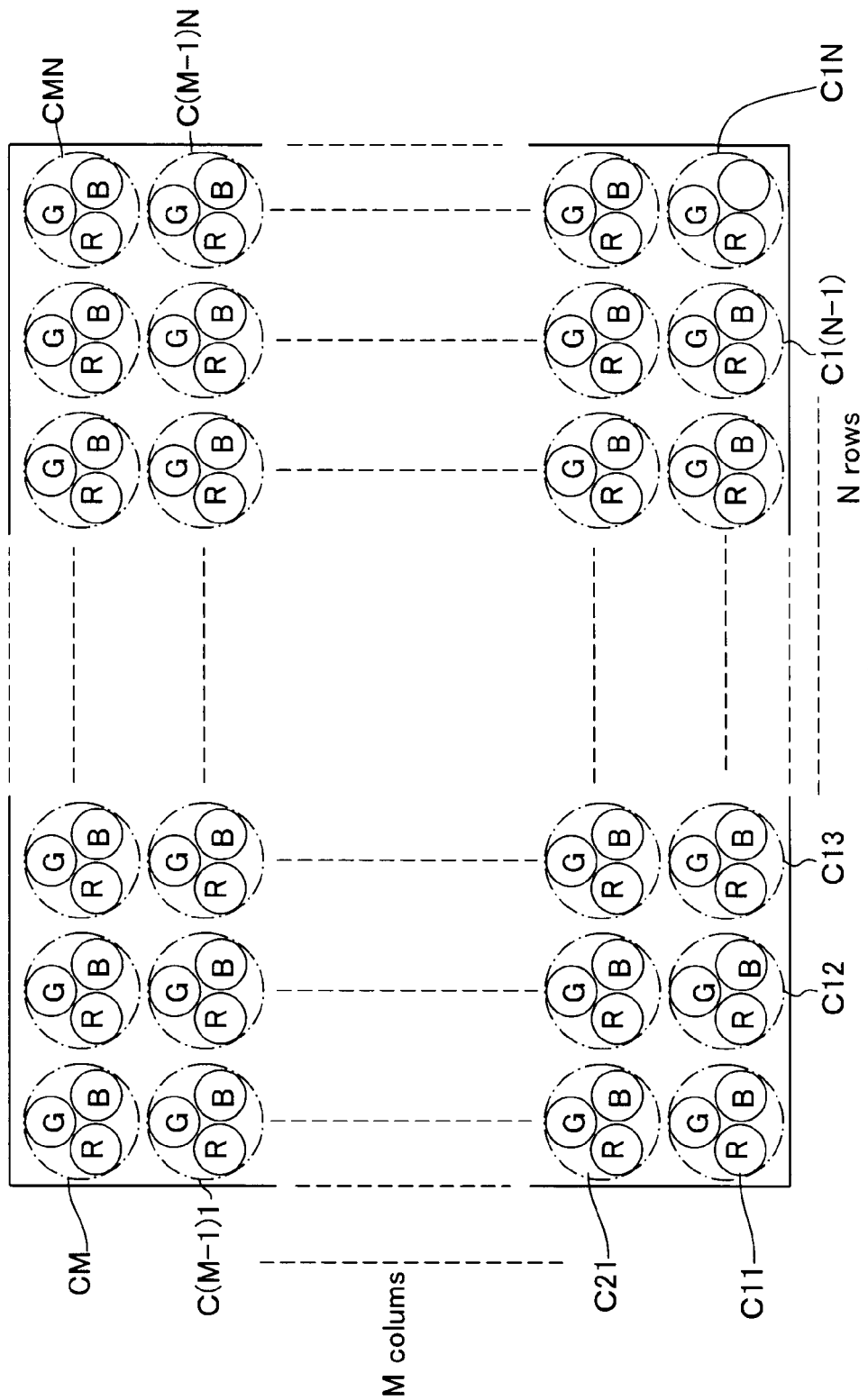
FIG. 11 is a partial sectional view showing yet another embodiment of a light-emitting device using a light-emitting diode according to the present invention.

The light-emitting device according to a second embodiment is illustrated in FIGS. 9 to 11. Referring first to FIGS. 9 and 10, it includes a combination of red, green, and blue light-emitting diodes R, G, B. In this light-emitting device, the light-emitting diodes R, G, B for red, green, and blue being the primary colors of light are combined (as one cell) to obtain white light.

Each of the red, green, and blue light-emitting diodes R, G, B is the light-emitting diode according to the present invention.

Referring next to FIG. 11, there is obtained a light-emitting device for white light with a large-area light-emitting surface, wherein the red, green, and blue light-emitting diodes R, G, B are combined as one cell and such cells (C11 to CMN) of the light-emitting diodes are arranged in M columns and N rows.

3. Lighting Apparatus

A lighting apparatus according to the present invention can be provided using the light-emitting devices shown in FIGS. 7 to 11. When using the light-emitting device shown in FIG. 7, two or more are arranged to emit neutral color or white color. Preferably, the light-emitting devices are arranged in the form of matrix (rows and columns) at a narrow pitch.

When using the light-emitting device shown in FIG. 8, then, since the light-emitting device itself has a large area, it can be used as it is to emit neutral color or white color. A further area increase can be achieved by arranging two or more light-emitting devices shown in FIG. 8 longitudinally or transversely.

When using the light-emitting device shown in FIGS. 9 and 10, two or more are arranged to emit neutral color or white color. Preferably, the light-emitting devices are arranged in the form of matrix (rows and columns) at a narrow pitch.

When using the light-emitting device shown in FIG. 11, since the light-emitting device itself has a large area, it can be used as it is to emit neutral color or white color. A further area increase can be achieved by arranging two or more light-emitting devices shown in FIG. 11 longitudinally or transversely.

4. Display

A display (display device) according to the present invention includes a liquid crystal display and a light-emitting diode display.

(1) Liquid Crystal Display

Figure 12:
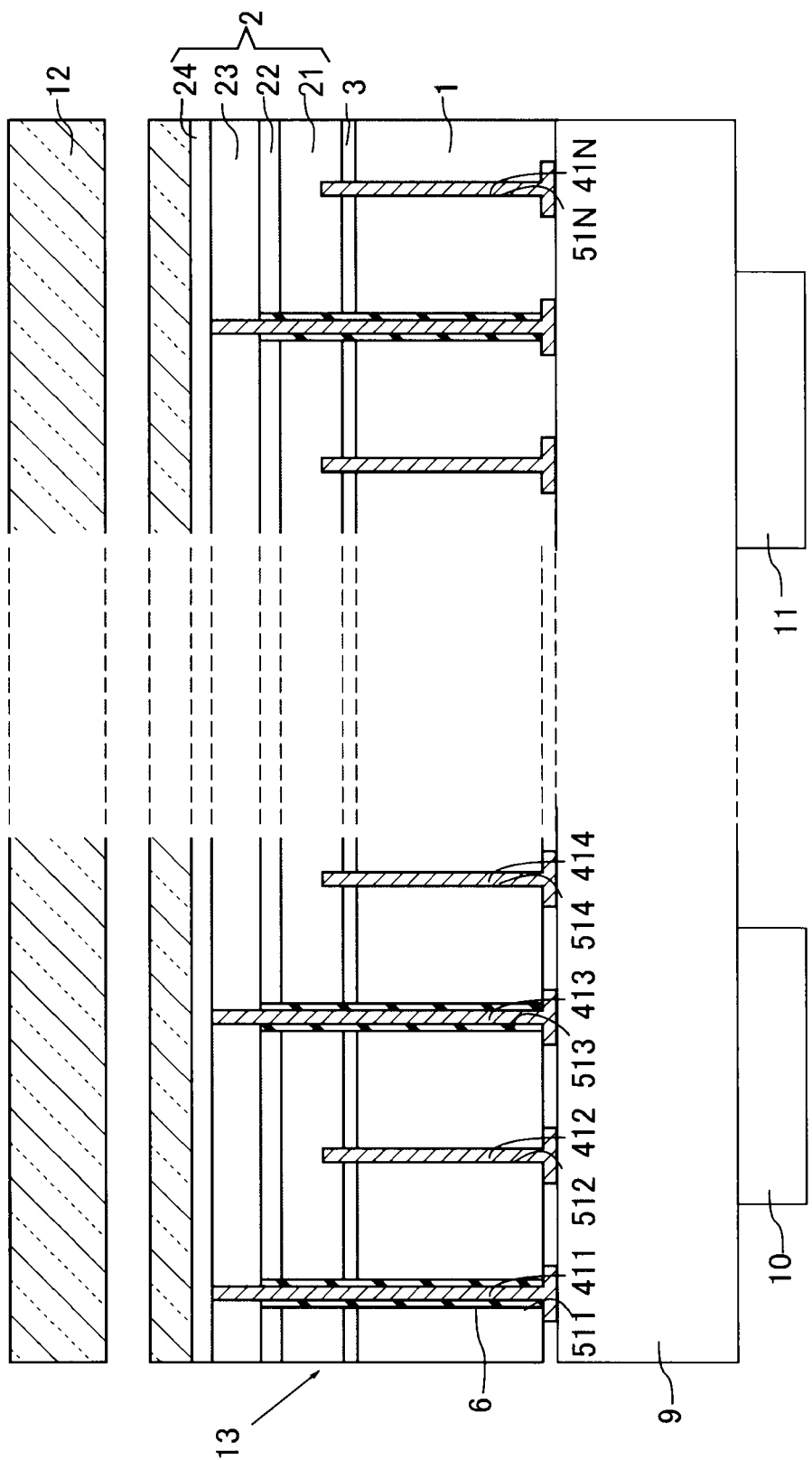
FIG. 12 is a partial sectional view showing a structure of a liquid crystal display using a light-emitting diode according to the present invention.

Referring to FIG. 12, the liquid crystal display includes a liquid crystal panel 12 and a backlight 13. The backlight 13 is the lighting apparatus according to the present invention using the light-emitting devices shown in FIGS. 7 to 11 and illuminates the liquid crystal panel 12 from behind. FIG. 12 illustrates a case using the light-emitting device shown in FIG. 8.

(2) Light-Emitting Diode Display

The light-emitting diode display according to the present invention includes a plurality of arranged light-emitting devices. Preferably, the light-emitting device is the light-emitting device shown in FIG. 11. That is, it includes a combination of the red, green, and blue light-emitting diodes R, G, B (as one cell). Each of the red, green, and blue light-emitting diodes R, G, B is the light-emitting diode according to the present invention. The red, green, and blue light-emitting diodes R, G, B, which are arranged like dots, are individually driven in each cell to display a desired color image.

5. Signal Light

A signal light according to the present invention can be provided by arranging light-emitting diodes. The light-emitting diode LED is the one according to the present invention. Required colored light of the signal light can be realized by the type of the light-emitting diode and its combination with the phosphor 8.

While the details of the present invention have been particularly described with reference to preferred embodiments, it will be understood by those skilled in the art that various changes in form may be made therein based on the basic technical idea and teaching of the invention.

What is claimed is:

1. A light-emitting diode comprising a substrate, a semiconductive light-emitting layer, and electrodes, wherein
    said semiconductive light-emitting layer is deposited on one side of said substrate,
    said electrodes are composed of a conductive material filled in pores leading to said semiconductive light-emitting layer through said substrate,
    said semiconductive light-emitting layer includes sequentially deposited n-type and p-type semiconductive layers,
    said electrodes include n-side and p-side electrodes,
    one of said n-side and p-side electrodes penetrates through one of said n-type and p-type semiconductive layers, which is disposed closer to said substrate but not targeted for connection, and terminates with a tip thereof located within the other semiconductive layer, and
    the other of said n-side and p-side electrodes penetrates through said substrate from the other side opposite to said one side of said substrate and terminates with a tip thereof located within said one semiconductive layer disposed closer to said substrate.

2. The light-emitting diode of claim 1, wherein said pores are distributed with a given surface density, and
    said n-side and p-side electrodes filled in said pores function as a current surface diffusion electrode for said n-type and p-type semiconductive layers.

3. A light-emitting device comprising a light-emitting diode and a phosphor, wherein
    said light-emitting diode includes a substrate, a semiconductive light-emitting layer, and electrodes,
    said semiconductive light-emitting layer is deposited on one side of said substrate,
    said electrodes are composed of a conductive material filled in pores leading to said semiconductive light-emitting layer through said substrate,
    said semiconductive light-emitting layer includes sequentially deposited n-type and p-type semiconductive layers,
    said electrodes include n-side and p-side electrodes,
    one of said n-side and p-side electrodes penetrates through one of said n-type and p-type semiconductive layers, which is disposed closer to said substrate but not targeted for connection, and terminates with a tip thereof located within the other semiconductive layer,
    the other of said n-side and p-side electrodes penetrates through said substrate from the other side opposite to said one side of said substrate and terminates with a tip thereof located within said one semiconductive layer disposed closer to said substrate, and
    said phosphor is disposed at a light-emitting side of said light-emitting diode for emitting light of a different color from that of said light-emitting diode.

4. The light-emitting device of claim 3, wherein said pores of said light-emitting diode are distributed with a given surface density, and
    said n-side and p-side electrodes filled in said pores function as a current surface diffusion electrode for said n-type and p-type semiconductive layers.

5. A light-emitting device comprising a combination of red, green, and blue light-emitting diodes, wherein
    each of said red, green, and blue light-emitting diodes includes a substrate, a semiconductive light-emitting layer, and electrodes,
    said semiconductive light-emitting layer is deposited on one side of said substrate,
    said electrodes are composed of a conductive material filled in pores leading to said semiconductive light-emitting layer through said substrate,
    said semiconductive light-emitting layer includes sequentially deposited n-type and p-type semiconductive layers,
    said electrodes include n-side and p-side electrodes,
    one of said n-side and p-side electrodes penetrates through one of said n-type and p-type semiconductive layers, which is disposed closer to said substrate but not targeted for connection, and terminates with a tip thereof located within the other semiconductive layer, and
    the other of said n-side and p-side electrodes penetrates through said substrate from the other side opposite to said one side of said substrate and terminates with a tip thereof located within said one semiconductive layer disposed closer to said substrate.

6. The light-emitting device of claim 5, wherein said pores of each of said red, green, and blue light-emitting diodes are distributed with a given surface density, and
    said n-side and p-side electrodes filled in said pores function as a current surface diffusion electrode for said n-type and p-type semiconductive layers.

7. A lighting apparatus comprising a plurality of arranged light-emitting devices, wherein
    said light-emitting device includes a light-emitting diode and a phosphor,
    said light-emitting diode includes a substrate, a semiconductive light-emitting layer, and electrodes,
    said semiconductive light-emitting layer is deposited on one side of said substrate,
    said electrodes are composed of a conductive material filled in pores leading to said semiconductive light-emitting layer through said substrate,
    said semiconductive light-emitting layer includes sequentially deposited n-type and p-type semiconductive layers, said electrodes include n-side and p-side electrodes,
one of said n-side and p-side electrodes penetrates through one of said n-type and p-type semiconductive layers, which is disposed closer to said substrate but not targeted for connection, and terminates with a tip thereof located within the other semiconductive layer,
the other of said n-side and p-side electrodes penetrates through said substrate from the other side opposite to said one side of said substrate and terminates with a tip thereof located within said one semiconductive layer disposed closer to said substrate, and
said phosphor is disposed at a light-emitting side of said light-emitting diode for emitting light of a different color from that of said light-emitting diode.

8. The lighting apparatus of claim 7, wherein said pores of said light-emitting diode are distributed with a given surface density, and
said n-side and p-side electrodes filled in said pores function as a current surface diffusion electrode for said n-type and p-type semiconductive layers.

9. A lighting apparatus comprising a plurality of arranged light-emitting devices, wherein
each of said light-emitting devices includes a combination of red, green, and blue light-emitting diodes,
each of said red, green, and blue light-emitting diodes includes a substrate, a semiconductive light-emitting layer, and electrodes,
said semiconductive light-emitting layer is deposited on one side of said substrate,
said electrodes are composed of a conductive material filled in pores leading to said semiconductive light-emitting layer through said substrate,
said semiconductive light-emitting layer includes sequentially deposited n-type and p-type semiconductive layers,
said electrodes include n-side and p-side electrodes,
one of said n-side and p-side electrodes penetrates through one of said n-type and p-type semiconductive layers, which is disposed closer to said substrate but not targeted for connection, and terminates with a tip thereof located within the other semiconductive layer, and
the other of said n-side and p-side electrodes penetrates through said substrate from the other side opposite to said one side of said substrate and terminates with a tip thereof located within said one semiconductive layer disposed closer to said substrate.

10. The lighting apparatus of claim 9, wherein said pores of said light-emitting diode are distributed with a given surface density, and
said n-side and p-side electrodes filled in said pores function as a current surface diffusion electrode for said n-type and p-type semiconductive layers.

11. A liquid crystal display comprising a liquid crystal panel and a backlight, wherein
said backlight is a lighting apparatus including a plurality of arranged light-emitting devices,
said light-emitting device includes a light-emitting diode and a phosphor,
said light-emitting diode includes a substrate, a semiconductive light-emitting layer, and electrodes,
said semiconductive light-emitting layer is deposited on one side of said substrate,
said electrodes are composed of a conductive material filled in pores leading to said semiconductive light-emitting layer through said substrate,
said semiconductive light-emitting layer includes sequentially deposited n-type and p-type semiconductive layers,
said electrodes include n-side and p-side electrodes,
one of said n-side and p-side electrodes penetrates through one of said n-type and p-type semiconductive layers, which is disposed closer to said substrate but not targeted for connection, and terminates with a tip thereof located within the other semiconductive layer,
the other of said n-side and p-side electrodes penetrates through said substrate from the other side opposite to said one side of said substrate and terminates with a tip thereof located within said one semiconductive layer disposed closer to said substrate,
said phosphor is disposed at a light-emitting side of said light-emitting diode for emitting light of a different color from that of said light-emitting diode, and
said backlight illuminates said liquid crystal panel from behind.

12. The liquid crystal display of claim 11, wherein said pores of said light-emitting diode are distributed with a given surface density, and
said n-side and p-side electrodes filled in said pores function as a current surface diffusion electrode for said n-type and p-type semiconductive layers.

13. A liquid crystal display comprising a liquid crystal panel and a backlight, wherein
said backlight is a lighting apparatus including a plurality of arranged light-emitting devices,
each of said light-emitting devices includes a combination of red, green, and blue light-emitting diodes,
each of said red, green, and blue light-emitting diodes includes a substrate, a semiconductive light-emitting layer, and electrodes,
said semiconductive light-emitting layer is deposited on one side of said substrate,
said electrodes are composed of a conductive material filled in pores leading to said semiconductive light-emitting layer through said substrate,
said semiconductive light-emitting layer includes sequentially deposited n-type and p-type semiconductive layers,
said electrodes include n-side and p-side electrodes,
one of said n-side and p-side electrodes penetrates through one of said n-type and p-type semiconductive layers, which is disposed closer to said substrate but not targeted for connection, and terminates with a tip thereof located within the other semiconductive layer,
the other of said n-side and p-side electrodes penetrates through said substrate from the other side opposite to said one side of said substrate and terminates with a tip thereof located within said one semiconductive layer disposed closer to said substrate, and
said backlight illuminates said liquid crystal panel from behind.

14. The liquid crystal display of claim 13, wherein said pores of said light-emitting diode are distributed with a given surface density, and
said n-side and p-side electrodes filled in said pores function as a current surface diffusion electrode for said n-type and p-type semiconductive layers.

15. A light-emitting diode display comprising a plurality of arranged light-emitting devices, wherein
each of said light-emitting devices includes a combination of red, green, and blue light-emitting diodes, each of said red, green, and blue light-emitting diodes includes a substrate, a semiconductive light-emitting layer, and electrodes, said semiconductive light-emitting layer is deposited on one side of said substrate, said electrodes are composed of a conductive material filled in pores leading to said semiconductive light-emitting layer through said substrate, said semiconductive light-emitting layer includes sequentially deposited n-type and p-type semiconductive layers, said electrodes include n-side and p-side electrodes, one of said n-side and p-side electrodes penetrates through one of said n-type and p-type semiconductive layers, which is disposed closer to said substrate but not targeted for connection, and terminates with a tip thereof located within the other semiconductive layer, and the other of said n-side and p-side electrodes penetrates through said substrate from the other side opposite to said one side of said substrate and terminates with a tip thereof located within said one semiconductive layer disposed closer to said substrate.

16. The light-emitting diode display of claim 15, wherein said pores of each of said red, green, and blue light-emitting diodes are distributed with a given surface density, and said n-side and p-side electrodes filled in said pores function as a current surface diffusion electrode for said n-type and p-type semiconductive layers.

17. A signal light comprising arranged light-emitting diodes, wherein said light-emitting diode includes a substrate, a semiconductive light-emitting layer, and electrodes, said semiconductive light-emitting layer is deposited on one side of said substrate, said electrodes are composed of a conductive material filled in pores leading to said semiconductive light-emitting layer through said substrate, said semiconductive light-emitting layer includes sequentially deposited n-type and p-type semiconductive layers, said electrodes include n-side and p-side electrodes, one of said n-side and p-side electrodes penetrates through one of said n-type and p-type semiconductive layers, which is disposed closer to said substrate but not targeted for connection, and terminates with a tip thereof located within the other semiconductive layer, and the other of said n-side and p-side electrodes penetrates through said substrate from the other side opposite to said one side of said substrate and terminates with a tip thereof located within said one semiconductive layer disposed closer to said substrate.

18. The signal light of claim 17, wherein said pores of said light-emitting diode are distributed with a given surface density, and said n-side and p-side electrodes filled in said pores function as a current surface diffusion electrode for said n-type and p-type semiconductive layers.

* * * * *